United States Patent [19]

Golladay et al.

[11] Patent Number: 4,843,330
[45] Date of Patent: Jun. 27, 1989

[54] ELECTRON BEAM CONTACTLESS TESTING SYSTEM WITH GRID BIAS SWITCHING

[75] Inventors: Steven D. Golladay, Hopewell Junction; Fritz J. Hohn, Somers, both of N.Y.; Hans C. Pfeiffer, Ridgefield, Conn.

[73] Assignee: International Business Machines Corporation, Armonk, N.Y.

[21] Appl. No.: 925,764
[22] Filed: Oct. 30, 1986
[51] Int. Cl.$^4$ .................. G01R 31/00; G01R 31/02
[52] U.S. Cl. .................. 324/158 R; 324/71.3; 324/73 R; 250/310
[58] Field of Search ........... 324/71.3, 73 R, 73 PC, 324/158 D, 158 R, 501, 538; 250/310, 311, 307, 492.2, 309

[56] References Cited

U.S. PATENT DOCUMENTS

| | | | |
|---|---|---|---|
| 3,448,377 | 6/1969 | Seiwatz | 324/54 |
| 3,448,776 | 6/1969 | Seiwatz et al. | 324/54 |
| 3,764,898 | 10/1973 | Bohlen et al. | 324/51 |
| 3,984,683 | 10/1976 | Larach | 250/307 |
| 4,220,853 | 9/1980 | Feuerbaum et al. | 324/158 R |
| 4,292,519 | 9/1981 | Feuerbaum | 324/158 R |
| 4,415,851 | 11/1983 | Langner et al. | 324/51 |
| 4,417,203 | 11/1983 | Pfeiffer et al. | 324/51 |
| 4,596,929 | 6/1986 | Coates et al. | 250/310 |
| 4,634,972 | 1/1987 | Fazekas | 324/158 R |
| 4,683,376 | 7/1987 | Feuerbaum | 324/158 R |
| 4,695,794 | 9/1987 | Bargett et al. | 324/158 D |

FOREIGN PATENT DOCUMENTS

| | | | |
|---|---|---|---|
| 104577 | 4/1984 | European Pat. Off. | |
| 0254741 | 12/1985 | Japan | 250/492.2 |
| 0440760 | 1/1968 | Switzerland | 250/311 |

OTHER PUBLICATIONS

IBM TDB vol. 27, No. 5, Oct. 1984, pp. 3021–3022, "Cemented Barrier Grid for Electron Beam Changing", by Speth.
Engel et al., "Electron Beam Testing of Wire or Printed Circuit Modules", vol. 3, No. 10, Oct. 1970, Journal of Physics D, Applied Physics, pp. 1505–1508.
Pfeiffer et al., Contactless Electrical Testing of Large Area Specimens Using Electron Beams, J. Vac. Sci. Technol., 19(4), Nov./Dec. 1981, pp. 1014–1018.
Pfeiffer, Contactless Electrical Testing with Multiple Electron Beams, Scanning Electron Microscopy, 1982/II, pp. 581–589.
Hohn et al., Electron Beam Testing and Its Application to Packaging Modules for VLSI Chip Arrays, Proc. Intern., SPIE Conf., San Jose, 1982.
Hohn et al., A Tripotential Method for Electrical Testing, 17th Symposium EIPBT, Montreal, 1982.
Sebseon et al., Noncontact Testing of Interconnections in Film Integrated Circuits Using an Electron Beam, Proc., 11th Ann. Rel. Phys. Conf., Las Vegas, Apr. 3–5, 1973, pp. 138–145.
Golladay et al., Stabilizer Grid for Contact Enhancement in Contactless Testing of MLC Modules, IBM Tech. Disc. Bull., vol. 25, No. 12, May 1983, pp. 6621–6623.
Chang et al., Tri-Potential Method for Testing Electrical Opens and Shorts in Multilayer Ceramic Modules, IBM Tech. Bull., vol. 24, 11A, Apr. 1982, pp. 5388–5390.
"Quantitative Voltage Contrast at High Frequencies in the SEM", by Bulk et al., Scan. Elec. Micros., 4/9/76, Proc. of Wk. Shop on Microelec. Dev. Fab., Cl. 250–311, pp. 615–624.
"Electron Beam Testing and its Application to Packaging Modules for VLSI Chip Arrays", by Hohn et al., Proc. Intermed. SPIE Conf., SAN/OSC, 12/82.

Primary Examiner—Reinhard J. Eisenzopf
Assistant Examiner—W. Burns
Attorney, Agent, or Firm—Douglas A. Lashmit; Graham S. Jones, II

[57] ABSTRACT

An electron beam system and method for testing three dimensional networks of conductors embedded in an insulating material specimen without physical contact to detect open and short circuit conditions. Top to top surface wiring is tested by irradiating the specimen with an electron beam at a first beam potential to charge the specimen while negatively biasing a grid placed above the specimen surface, and then irradiating selected portions of the specimen with an electron beam at a second beam potential to read the charge on selected conductors while applying a zero or a positive bias to the grid. In one embodiment the charge beam is a focused scanning beam and the first beam potential is preferably greater than the second beam potential.

13 Claims, 3 Drawing Sheets

ELECTRON BEAM CONTACTLESS TESTING SYSTEM WITH GRID BIAS SWITCHING

BACKGROUND OF THE INVENTION

The present invention relates to testing the continuity of electrical conductors without any physical contact, and more particularly to a system and method of using an electron beam to test conductive networks in an insulating specimen, the networks having terminations on at least one surface of the specimen. In one application, the system is employed to test networks in modules formed of multi-layer ceramic (MLC) laminates.

It is desirable in the manufacture of integrated circuit devices to test for defects at an early stage of fabrication in order to minimize the cost of repairing such defects and to maximize the yield of operable devices. The small size and high density of present devices creates a need for a test system other than conventional mechanical probe systems which rely on physical contact with the conductor terminations. In certain applications, such physical contact can damage the device under test. With the introduction of multi-layer packaging such as MLC, mechanical and optical techniques are also limited by resolution.

MLC packages are particularly exemplary of testing difficulties often encountered. Such packages are formed of multiple layers of unfired ceramic substrates having conductive material deposited thereon. Contact from one layer to another is achieved by vias punched in each layer and filled with conductive material.

The unfired substrates have a paste-like consistency, so that physical contact would damage the specimen. The individual substrates are subsequently pressed together to form laminates and then fired to produce the MLC module. The fired modules are more susceptible to mechanical probing, although reliable probing is difficult to achieve because of surface irregularities, the small size of the features being probed, and displacement of the features due to shrinkage of the module during firing.

The use of electron beam systems to provide noncontact testing has been proposed. For example, U.S. Pat. No. 3,764,898 proposed a method for bombarding at least one end of a conductor with an electron beam, measuring the secondary emission of electrons at the one end to detect the potential thereat, and measuring the current that flows through the conductor to determine its state of continuity. U.S. Pat. Nos. 4,415,851 and 4,417,203 disclose systems for testing networks including both top to bottom and top to top connections. The systems include two electron beam flood guns and a scanning beam gun. The scanning beam is arranged to scan the top surface of the specimen under test. One flood gun irradiates the bottom surface for top to bottom testing, and the other flood gun irradiates the top surface for testing top to top connections.

Chang et al., in "Tri-Potential Method for Testing Electrical Opens and Shorts in Multi-Layer Ceramic Packaging Modules," *IBM Technical Disclosure Bulletin* vol. 24, no. 11A, pp. 5388–5390, April 1982, disclose a method for MLC testing using localized charging wherein a scanning electron beam addresses test points on the top surface of the module at two different potentials, one for charging and one for detection. A second beam, which can be either a scanning beam or a flood beam, is used to charge the back side of the module at a third potential. Other systems for such testing are described by Pfeiffer et al. in "Contactless Electrical Testing of Large Area Specimens Using Electron Beams," *J. Vac. Sci. Techno.*, vol. 19, no. 4, pp. 1014–1018. Golladay et al. suggested the addition of a negatively biased stabilizer grid between the back side flood gun and the specimen to increase the uniformity of charging and to control the potential to which the networks are charged, in "Stabilizer Grid for Contrast Enhancement in Contactless Testing of MLC Modules," IBM Technical Disclosure Bulletin, vol. 25, no. 12, pp. 6621–6623, May 1983.

The system of Chang provides a means of testing electrical conductors without physical contact; however, it is limited in that all conductive materials cannot be tested. In Chang, the conductors must be charged by an electron beam with an energy higher than that corresponding to the second crossover potential of the material under test. This condition is readily fulfilled for materials such as molybdenum, nickel and copper, which require a charge potential of about 4 KV and a read or detection potential of about 2 KV. However, for materials such as lead-tin and gold, with crossover potentials of about 5–6 KV and 8–9 KV, respectively, significantly higher charge beam potentials are required. Even if such potentials could be achieved in a production test system, it would be difficult to meet the required high speed operation since switching of the high beam potential must preferably be done within approximately 100 microseconds.

In U.S. Pat. No. 4,417,203 a flood gun is used to create a negative charge on all conductors on the top surface of the specimen being tested. Since a fixed flood potential is used, the beam potential limitations of Chang et al. are not a problem. After the specimen is negatively charged by the flood beam, a selected network is scanned by a focused probe beam which discharges all conductors in the selected network. If there is an open circuit the corresponding terminal will still be charged. The other conductive networks in the specimen are then tested. If the first point of a subsequently scanned network is already discharged, this is an indication of a short circuit between the conductor connected to that terminal and one of the previously tested networks. One disadvantage of this technique is that the discharged networks tend to become negatively charged again due to the attraction to the networks of any low energy electrons present in the system. This is because the discharged networks are positive relative to the rest of the specimen being tested. This instability or negative charging can mask the detection of short circuit defects.

SUMMARY OF THE INVENTION

The present invention overcomes the shortcomings of prior systems by providing a contactless testing system capable of testing conductive materials by employing a relatively low potential electron beam, independent of the second crossover potential of the material under test.

The system includes a conductive grid placed above the same surface of the specimen under test upon which the scanning electron beam impinges. The grid is negatively biased while the networks to be tested are charged in order to repel secondary electrons back toward the specimen and enhance charging of the conductive material. The bias is removed during the scanning of the specimen by the read beam so that the secondary electron can be detected. Alternatively, a positive bias is applied to the grid during the read cycle to ensure that all emitted secondary electrons are detected in order to enhance the detected voltage contrast.

It is therefore an object of the present invention to provide a contactless testing system and method for testing conductive materials regardless of the second crossover potential of the material being tested.

Another object of the invention is to provide an electron beam contactless testing system including a conductive grid closely spaced to one surface of the specimen under test and means to bias the grid at a first potential while the specimen is charged and a second potential while the specimen is scanned by a read beam.

Yet another object of the present invention is to provide a system and method for testing conductive materials in an insulating specimen by using an electron beam having a beam potential lower than the second crossover potential of the conductive material under test.

BRIEF DESCRIPTION OF THE DRAWINGS

Other objects and many of the attendant advantages of the present invention will be better understood by reference to the following detailed description in conjunction with the accompanying drawings, in which like reference numerals designate the same or similar parts throughout the several views, and wherein.

DESCRIPTION OF THE PREFERRED EMBODIMENTS

Figure 1:
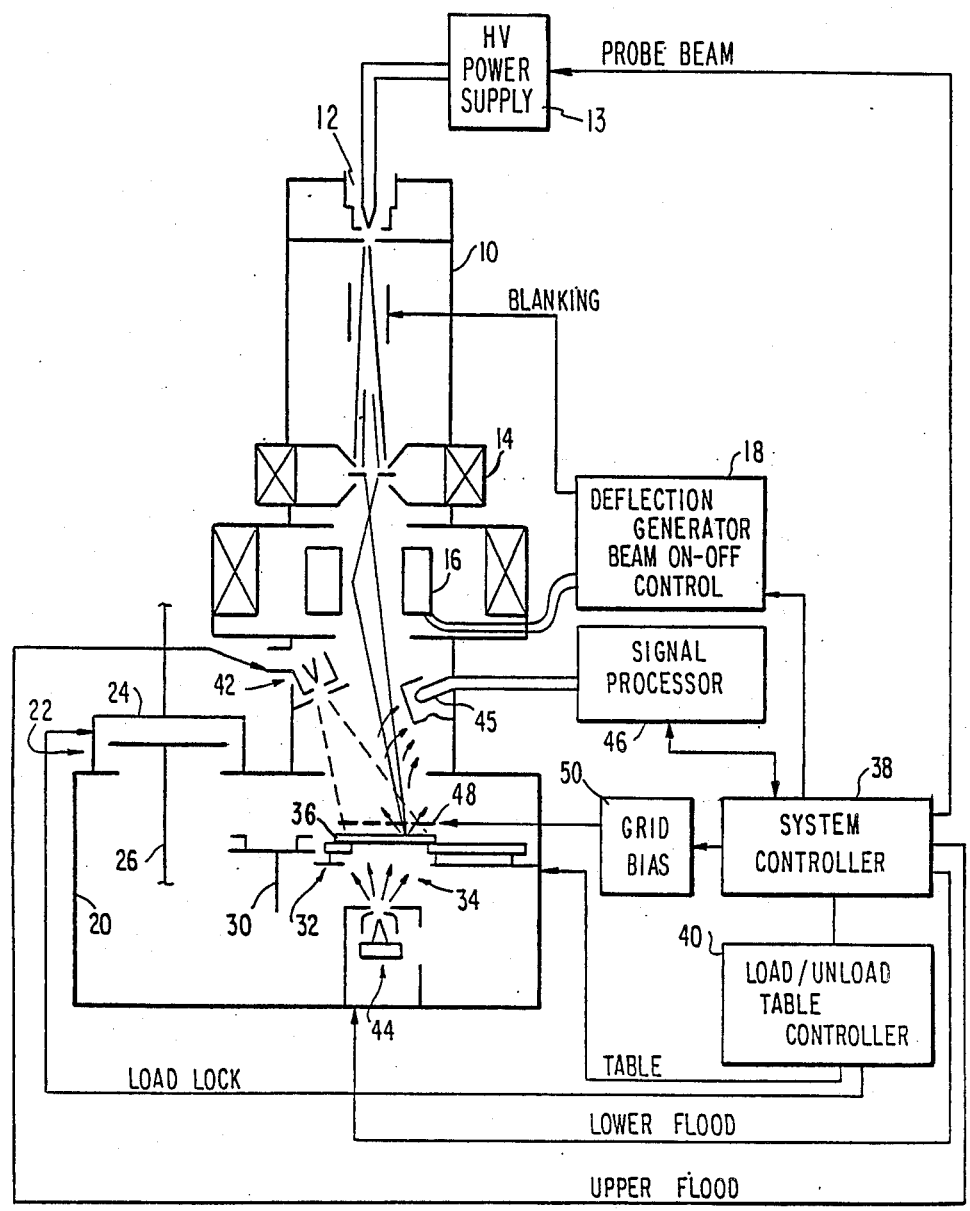
FIG. 1 is a schematic view showing the architecture of a test system incorporating the present invention.

Referring now to FIG. 1, the architecture of a preferred embodiment of a basic system including the present invention is shown. This system is similar to the system shown and described in U.S. Pat. No. 4,417,203, assigned to the assignee of the present invention. A system capable of completely testing such specimens as MLC modules will be described, i.e., one capable of testing the continuity of networks having both top to bottom and top to top terminations. The present invention, however, is primarily intended to improve the capability of testing networks having top to top terminations.

SYSTEM ARCHITECTURE

An electron beam vacuum column 10 has an electron beam probe gun 12 disposed at one end thereof. A switchable high voltage power supply 13 provides a selectable accelerating potential to gun 12. A focusing lens system 14 comprising annular coils is used to focus the beam emanating from probe gun 12. Deflection coils 16, driven by a deflection generator 18, are used for beam steering. Additional focus and deflection coils (not shown) may be employed as required, depending upon the size of the field to be scanned. The electron optics are similar to those of scanning electron microscope systems known in the art.

A processing vacuum chamber 20 has a load lock 22 with a lock port 24 to automatically handle specimens to be tested. A loading mechanism 26 is used to receive specimens that are mounted on carriers at load lock 22 and move them to transfer table 30. By means of mechanical pushers, air techniques and the like, specimens are moved from the transfer table 30 onto the specimen table 32. The table 32 is selectively movable in the X-Y directions perpendicular to the axis of beam 12 to position the specimen within the beam deflection field. The table 32 has a port 34 large enough to expose the bottom side of specimen 36. The specimens, once testing is complete, are then transferred in a reverse manner back to the load lock 22 such that when lock port 24 is raised, those specimens previously tested are removed from the chamber 20 and new specimens to be tested are introduced. Loading, unloading and table movement are controlled by a system controller 38 which provides instructions to a specimen handling controller 40. Electronic control of transfer movement and port access in a manner coordinated with the overall test procedure is well known in this technology. Such techniques are also well known in semiconductor lithography. The specific aspects of system controller 38 and controller 40 form no part of the present invention.

The system includes an upper flood gun 42 and a lower flood gun 44 which are selectively activated in a manner to be described herein, in order to charge the respective top and bottom surfaces of the specimen 36 during various test procedures. Other beam arrangements may also be employed, for example, a second independently controlled scanning beam (not shown) for charging the surfaces of the specimen.

Disposed within column 10 is a secondary electron detector 45. Secondary electron emission is a result of scanning by the probe beam from gun 12 and is detected by detector 45 which provides an output signal to processor 46. The output signal, converted to digital form, is provided to system controller 38 for purposes of defect detection, and can be displayed and/or stored on a real time monitor (not shown).

Mounted above and in a plane substantially parallel to the top surface of specimen 36 is a conductive grid 48. The grid 48 is connected to a grid bias generator 50 which, responsive to system controller 38, applies either a negative, a zero or a positive potential to grid 48 as will be explained in more detail herein. In a preferred embodiment, referring to FIG. 2, grid 48 is formed of a wire mesh having first and second sets of parallel, cylindrical conductors 52, 54 with the first set of conductors being substantially orthogonal to the second. The size of the conductors, the spacing therebetween and the distance between the grid 48 and the surface of the specimen 36 under test will vary depending upon the electrical operating parameters of a particular test system. The grid 48 must effectively be transparent to the electron probe beam so that it can penetrate grid 48 without an unacceptable amount of dispersion. For this to occur grid 48 must be mounted a sufficient distance from the surface of the specimen 36. The distance depends, inter alia, on the probe beam diameter and angle, since a beam with a wider angle will defocus more quickly as the distance above the specimen increases. Thus, in the case of a probe beam having a wider angle, grid 48 could be mounted a smaller distance from the specimen without dispersing the beam.

The size of the conductors 52, 54 and the spacing therebetween must also be carefully chosen. Grid 48 is easier to fabricate with conductors having a larger diameter; however, this would necessitate moving the grid farther from the specimen as explained above. Similarly, it is easier to fabricate a grid with a larger spacing between conductors. The disadvantage of a grid having a larger or more open mesh is that a greater bias potential is required in order to generate an electric field having the minimum field potential necessary to achieve the desired effect.

The secondary electrons emitted from the specimen 36 have well known energy and angular distributions. A majority of the secondary electrons have a kinetic energy of less than about −5 eV. These secondary electrons would, therefore, be effectively repelled back to the surface of specimen 36 by a potential of about −5 volts.

In operation, input data is supplied to the system controller 38 providing the addresses of the specimen points to be tested and the expected outputs if electrical continuity is present. Controller 38 provides signals to the deflection generator and beam on-off control 18 in order to control the exposure (on-off) and the deflection of the probe beam. Controller 38 also selects the beam potential of gun 12 by a signal to power supply 13, and determines which of the flood guns 42 or 44 will be actuated and in the proper sequence with the probe beam. Such controller functions are well known in the electron beam lithography art.

Either flood gun 42 or 44 is activated to charge one surface of the specimen and it may or may not be turned off, depending upon the test to be performed. Although it does not form a part of the present invention, the lower flood gun 44 is used to test networks having conductors extending from the top surface to the bottom surface of the specimen 36. In this mode the probe or read beam is then scanned across the specimen in a vector or a raster mode to the addresses supplied by controller 38. The read beam causes the generation of secondary electrons from the surface of the specimen and the emitted electrons are sensed by detector 45. The output of detector 45 is amplified, digitized and compared in the signal processor 46.

While the present system can test either connections between the top and bottom surfaces of the specimen or those between two or more different points on the same surface, only the latter will be described in detail since the negative grid bias is used only for top to top conductor testing.

Localized Charging Mode

In one embodiment of the present invention each network to be tested is first selectively charged by the probe beam at a charge potential while grid 48 is negatively biased, and then read by the probe beam at a read potential while a zero or a positive bias is applied to grid 48. The charge potential of the probe beam is greater than the read potential. Prior to localized charging of a selected network, the surface of the specimen is preferably brought to a uniform potential by scanning the specimen with the probe beam at the read potential while grid 48 is positively biased.

A selected network is locally charged by scanning the network and applying a negative bias of at least about −10 volts to grid 48 by means of bias generator 50. The negative bias is switched off while the charged network is read by the probe beam so that any secondary electrons emitted from the specimen 36 surface can be sensed by detector 45. Alternatively, a positive bias potential may be applied to grid 48 during the read cycle to accelerate secondary electrons toward detector 45. This provides voltage contrast enhancement and improved signal to noise ratio for signal processor 46.

Figure 3:
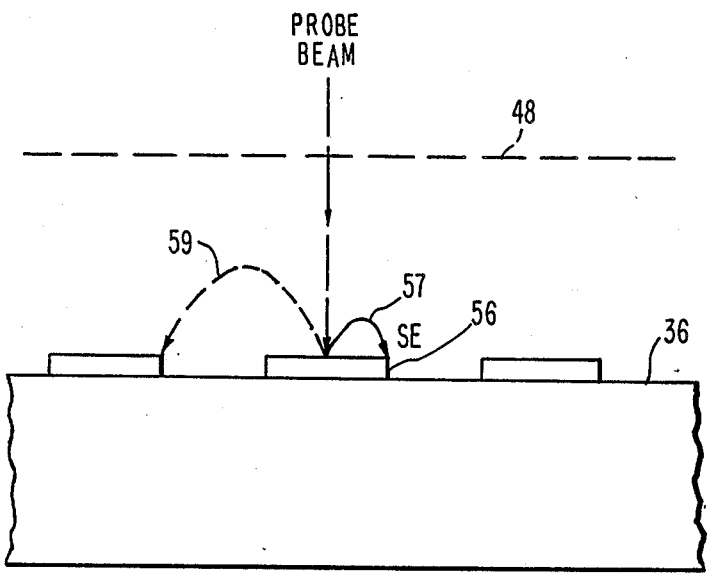
FIG. 3 is a diagrammatic view of a specimen illustrating the effect of grid bias on secondary electron trajectories.

Referring to FIG. 3, to achieve localized charging of a selected network the magnitude of the bias potential on grid 48 must be chosen so that the −5 volt equipotential line is sufficiently close to the conductor 56 being charged. This is necessary to cause a sufficient number of secondary electrons (SE) generated by the probe beam to return to conductor 56, as shown by the SE trajectory 57. If the equipotential line is too far from the surface of specimen 36 the secondary electrons could return to an adjacent conductor as shown by trajectory 59. The equipotential line can be moved closer to the surface of specimen 36, for example, by making the grid 48 bias more negative, by moving grid 48 closer to specimen 36, by placing the grid conductors 52, 54 closer together, or by a combination of these techniques. Different grid 48 geometries will also affect the required bias potential.

Figure 2:
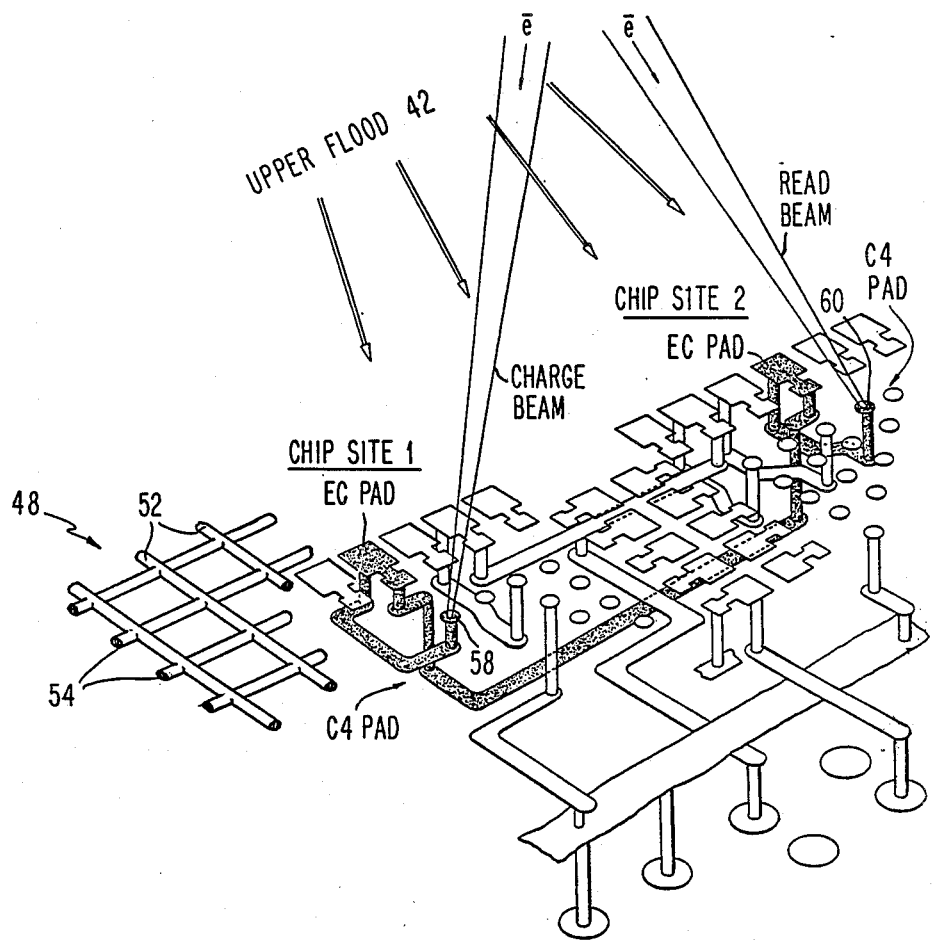
FIG. 2 is a schematic cutaway perspective of a specimen showing a network under test.

The localized charging technique will be better understood by reference to FIG. 2, which shows a three dimensional wiring network such as those used in an MLC module. Each level of the network is formed on one layer of the MLC laminates, with the level to level connections being made through vias filled with a conductive material. For clarity of illustration only two chip sites and a portion of the associated wiring are shown. Each chip site includes a plurality of C4 pads for contacting the integrated circuit chip to be mounted thereon, and a plurality of engineering change (EC) pads for making any necessary wiring changes after the MLC module is completed.

To find open and short circuits in the localized charging mode of testing, the probe beam is employed to both charge and read the network under test. A higher potential probe beam, indicated as the "charge" beam in FIG. 2, is stepped to the first endpoint 58 of the network while a negative bias is applied to grid 48. A lower potential read beam is then stepped to the other endpoints of the charged network, while a zero or a positive bias is applied to grid 48. When the probe beam charges the first endpoint 58 then the entire network is charged if there are no open circuits. An open circuit is present, for example, at point 60, if no charge is detected when that point is scanned by the probe beam at a read potential. The first endpoint of the next network is then read and, if a charge is detected, a short circuit to one of the previously tested networks is indicated. If no charge is detected then this network is charged and then each point therein is read as before. The sequence is thus read-charge-read. In a modified technique each point in the second network can be read before that network is charged. This procedure is continued until all networks have been tested.

Figure 4:
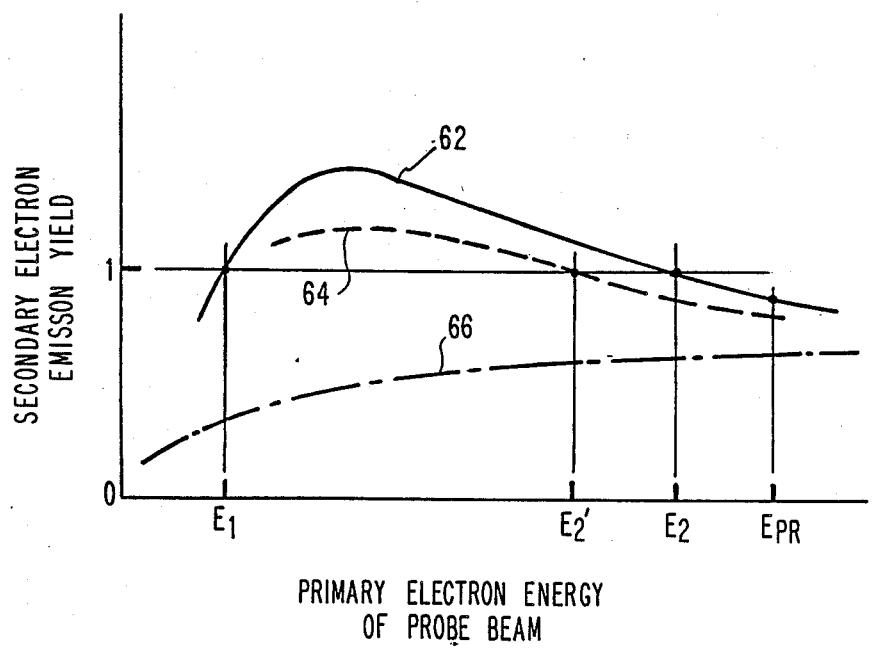
FIG. 4 is a graph showing secondary electron emission yield as a function of primary electron energy of an impinging beam for different grid bias potentials.

The effect of the negative grid bias of the present invention on specimen charging is illustrated in FIG. 4, which is a graph of the yield of secondary electrons emitted from a specimen as a function of the impact energy of the primary electrons of the charge beam. For most materials, in the presence of a high extraction field, an energy range exists for the primary electrons where the secondary emission yield is greater than unity. The high extraction field can be generated by applying a positive bias to grid 48. At two values $E_1$ and $E_2$ the secondary electron yield is unity, i.e., the same number of secondary electrons are emitted as the number of primary electrons from the probe beam strike the specimen. For any impact energy other than $E_1$ or $E_2$, e.g., $E_{PR}$, an insulator or electrically isolated specimen surface tends to charge up to reach a steady state potential with equilibrium between incoming and outgoing electrons. For energy values greater than $E_1$ and less than $E_2$, the net charge of the specimen is positive, while at other primary electron energies the net charge is negative.

In conventional testing techniques, a negative charge is deposited on the specimen by using a beam having an energy $E_{PR}$ greater than the second crossover point $E_2$ while the read energy is typically at or near $E_2$. The energy distribution of the secondary electrons contains the information of the surface potential from which they are emitted. The second crossover point of the conductive material being tested had to be low in prior localized charging test methods in order to achieve high speed operation of the test system. This requirement is achieved for metals such as molybdenum, nickel and copper requiring a read potential of about 2 KV and a charge potential of about 4 KV. However, for metals with a high second crossover point such as lead-tin (5–6 KV) and gold (8–9 KV) conventional test techniques are unsuccessful.

By applying a negative bias to grid 48 as in the present test method, the secondary electron yield curve is as depicted by curve 64 of FIG. 4. If a more negative bias is applied, curve 66 results. In the case of curve 64 the second crossover potential $E_2'$ is decreased, therefore the probe beam energy required to negatively charge the specimen is also decreased. In the case of curve 66, any probe beam energy is sufficient to negatively charge the specimen.

The technique of locally charging a network in combination with a negatively biased grid was experimentally verified by testing a network formed of lead-tin, which has a second crossover potential of about 5–6 KV. The conductors 52, 54 of grid 48 were formed of 6 micron diameter tungsten wire with a spacing of about 1 mm., and the grid was placed about 2 mm. above the specimen. A read beam potential of about 1 KV and a grid bias of about +30 volts was used to place a uniform positive charge on the specimen prior to locally charging the networks. Detector 45 output signal values were less than about 0.5 volts during this process. The network was then charged with a beam potential of about 3 KV and a grid bias of about −10 volts, and then read with the same probe beam read potential and positive grid bias as before. The detector 45 output signals after charging were at least a factor of two greater than the before charge values. Even higher contrast ratios can be obtained by adjusting the charging time of the networks, typically on the order of a few microseconds, according to the network capacitance.

Flood Charging Mode

The grid bias switching technique of the present invention can be applied to the conventional flood charging test described in U.S. Pat. No. 4,417,203 to provide similar enhancement of the voltage contrast ratio of the detector 45 output signals and to provide a more uniform charging of the conductors while controlling the potential to which they are charged.

The conventional flood beam test is modified by applying a negative potential to grid 48 while the upper flood gun 42 is charging all networks in the top surface of specimen 36. The networks are selectively discharged, and then read while a positive bias is applied to grid 48 to create a high extraction field. The remaining networks are then discharged and read as described in the referenced patent.

While the invention has been particularly shown and described with reference to the preferred embodiments thereof, those skilled in the art having the benefit of the foregoing detailed description will understand that various changes in form and details may be made therein without departing from the spirit and scope of the invention.

What is claimed is:

1. A system for contactless testing of electrical conductors disposed in and terminating on at least one surface of an insulating material specimen, comprising:
   (a) a first electron beam generator for irradiating said one surface of said specimen at a first beam potential;
   (b) said first electron beam generator comprising a flood beam generator,
   (c) a scanning electron beam generator for irradiating selected portions of said one surface of said specimen at a second beam potential;
   (d) a conductive grid mounted above said one surface of said specimen substantially parallel thereto and closely spaced to said one surface;
   (e) bias means connected to said grid for
      (1) applying a negative, first grid potential thereto while said electrical conductors are irradiated by an electron beam from said first electron beam generator at said first beam potential, and
      (2) then applying a second potential to said grid while said selected electrical conductors are irradiated by an electron beam from said scanning electron beam generator at said second potential;
   (f) detector means for sensing secondary electrons emitted from said one surface of said specimen;
   (g) said first electron beam generator comprises a flood beam generator; and
   (h) said first beam potential being less than the second crossover potential of the material forming said electrical conductors and greater than said second beam potential.

2. The system of claim 1 wherein
   (i) said second potential applied to said grid is greater than or equal to zero volts.

3. The system of claim 2 wherein
   (j) said conductive grid is formed of a matrix of wires, and
   (k) said grid is substantially parallel to and spaced apart from said one surface of said specimen a sufficient distance so as not to unduly disperse said scanning electron beam.

4. A method for the contactless testing of electrical conductors disposed in and terminating on at least one surface of an insulating material specimen, comprising:
   (a) irradiating said one surface of said specimen with an electron beam while applying a positive bias potential to an entire conductive grid comprised of a plurality of conductive wires disposed above said one surface substantially parallel thereto and closely spaced to said one surface, whereby a uniform potential is applied to said one surface of said specimen;
   (b) irradiating selected portions of said one surface of said specimen with an electron beam at a first beam potential while said grid is biased at a negative potential;

(c) irradiating selected portions of said one surface of said specimen with an electron beam at a second beam potential while said grid is biased at a potential greater than or equal to zero volts; and (d) detecting any change in potential of said electrical conductors irradiated by said electron beam at said second beam potential.

5. The method of claim 4, wherein (e) said first beam potential is greater than said second beam potential.

6. A method for the contactless testing of electrical conductors disposed in and terminating on at least one surface of an insulating material specimen, comprising:

(a) irradiating said one surface of said specimen with an electron beam while applying a positive bias potential to a conductive grid disposed above said one surface substantially parallel thereto and closely spaced to said one surface, whereby a uniform potential is applied to said one surface of said specimen;

(b) irradiating selected portions of said one surface of said specimen with an electron beam at a first beam potential while said grid is biased at a negative potential;

(c) irradiating selected portions of said one surface of said specimen with an electron beam at a second beam potential while said grid is biased at a potential greater than or equal to zero volts; and (d) detecting any change in potential of said electrical conductors irradiated by said electron beam at said second beam potential (e) said first beam potential is greater than said second beam potential, and (f) said steps of irradiating said one surface of said specimen are carried out with a single scanning electron beam at said first and second beam potentials, and (g) said step of irradiating said specimen to apply a uniform potential thereto is carried out at said second beam potential.

7. The method of claim 6, wherein (h) said negative grid bias potential is a potential sufficient to repel secondary electrons back toward said one surface of said specimen while said one surface is being irradiated by said electron beam at said first beam potential.

8. The method of claim 7, wherein said grid is biased at a positive potential sufficient to extract substantially all secondary electrons emitted from said one surface of said specimen while said one surface is being irradiated by said electron beam at said second beam potential.

9. A method for the contactless testing of electrical conductors disposed in and terminating on at least one surface of an insulating material specimen, comprising:

(a) irradiating said one surface of said specimen with an electron beam while applying a positive bias potential to a conductive grid disposed above said one surface substantially parallel thereto and closely spaced to said one surface, whereby a uniform potential is applied to said one surface of said specimen;

(b) irradiating selected portions of said one surface of said specimen with an electron beam at a first beam potential while said grid is biased at a negative potential;

(c) irradiating selected portions of said one surface of said specimen with an electron beam at a second beam potential while said grid is biased at a potential greater than or equal to zero volts; and (d) detecting any change in potential of said electrical conductors irradiated by said electron beam at said second beam potential, (e) said first beam potential is greater than said second beam potential, (f) said second irradiating step is carried out with a flood beam while a negative bias potential is being applied to said grid, and (g) said third irradiating step is carried out with a scanning electron beam at said second beam potential while a positive bias potential is being applied to said grid.

10. The method of claim 9, wherein (h) said negative grid bias is at a potential sufficient to repel secondary electrons back toward said one surface of said specimen while said one surface is being irradiated by said electron beam at said first beam potential.

11. The method of claim 10, wherein (i) said grid is biased at a positive potential sufficient to extract substantially all secondary electrons emitted from said one surface of said specimen while said one surface is being irradiated by said electron beam at said second beam potential.

12. A system for contactless testing of electrical conductors disposed in and terminating on at least one surface of an insulating material specimen, comprising:

(a) a scanning electron beam generator for irradiating selected portions of said one surface of said specimen at first and second beam potentials;

(b) a conductive grid comprising a wire mesh of conductors mounted above said one surface of said specimen, substantially in a plane parallel thereto and closely spaced to said one surface;

(c) bias means connected to said grid for:
  (1) applying a negative first grid potential to all of said conductors of said grid while said selected electrical conductors are irradiated by an electron beam from said generator at said first beam potential, and
  (2) then applying a second grid potential to all of said conductors of said grid while said selected electrical conductors are irradiated by said electron beam at said second beam potential; and (d) detector means for sensing secondary electrons emitted from said one surface of said specimen.

13. A system for contactless testing of electrical conductors disposed in and terminating on at least one surface of an insulating material specimen, comprising:

(a) a scanning electron beam generator for irradiating selected portions of said one surface of said specimen at first and second beam potentials;

(b) a conductive grid comprising a mesh of first and second sets of parallel conductors mounted above said one surface of said specimen, substantially in a plane parallel thereto and closely spaced to said one surface, said first set being substantially orthogonal to said second set;

(c) bias means connected to said grid for:
  (1) applying a negative first grid potential to all of said conductors of said grid while said selected electrical conductors are irradiated by an electron beam from said generator at said first beam potential, and
  (2) then applying a second grid potential to all of said conductors of said grid while said selected electrical conductors are irradiated by said electron beam at said second beam potential; and (d) detector means for sensing secondary electrons emitted from said one surface of said specimen.

* * * * *